United States Patent [19]

Bower

[11] Patent Number: 5,445,721

[45] Date of Patent: Aug. 29, 1995

[54] ROTATABLE MAGNETRON INCLUDING A REPLACEMENT TARGET STRUCTURE

[75] Inventor: John H. Bower, Livermore, Calif.

[73] Assignee: The BOC Group, Inc., New Providence, N.J.

[21] Appl. No.: 296,237

[22] Filed: Aug. 25, 1994

[51] Int. Cl.⁶ .................................. C23C 14/35
[52] U.S. Cl. .................. 204/192.12; 204/298.21; 204/298.22; 204/298.23
[58] Field of Search ............ 204/192.12, 298.21, 204/298.22, 298.23

[56] References Cited

U.S. PATENT DOCUMENTS

| | | | |
|---|---|---|---|
| 4,445,997 | 5/1984 | McKelvey | 204/298.22 X |
| 4,466,877 | 8/1984 | McKelvey | 204/298.22 X |
| 5,096,562 | 3/1992 | Boozenny et al. | 204/298.22 |
| 5,100,527 | 3/1992 | Stevenson et al. | 204/298.22 |
| 5,200,049 | 4/1993 | Stevenson et al. | 204/298.22 |

Primary Examiner—Nam Nguyen
Attorney, Agent, or Firm—David A. Draegert; Larry R. Cassett

[57] ABSTRACT

An improved rotatable magnetron enabling efficient removal and replacement of a target structure, having axially movable structures including at least one spindle, which may be extended to engage or retracted to disengage the target structure, and means for extending into a magnet structure within the target structure to selectively fix a rotational position of the magnet structure, and preferably having water and vacuum seals integrated into cartridges which are disposed between spindles and seal housings of the improved rotatable magnetron.

15 Claims, 5 Drawing Sheets

ROTATABLE MAGNETRON INCLUDING A REPLACEMENT TARGET STRUCTURE

BACKGROUND OF THE INVENTION

The present invention is related generally to a magnetron apparatus for coating substrate articles by sputtering, and more particularly, to an improved rotatable magnetron apparatus including a replaceable target structure. Additionally, the present invention is related to an improved method of replacing a target structure of the rotatable magnetron apparatus.

The coating of large area substrates, such as architectural glass, automobile windshields and the like, has been accomplished by a sputtering process that includes the use of a planar magnetron. Such coatings include multilayer solar control coatings that are widely used on commercial building windows. Because of the large surface area of the glass to be coated, the coating machinery is very large in scale.

More recently, a rotatable magnetron apparatus has been developed for such coating applications to overcome some of the problems known to inhere in the planar magnetron. A rotatable magnetron is described in U.S. Pat. No. 5,096,562, issued to Alex Boozenny and Josef T. Hoog on Mar. 17, 1992, the entire disclosure of which is incorporated herein by this reference.

Operation of the rotatable or rotating magnetron generally includes the rotation of a substantially cylindrical sputtering target in high vacuum about a stationary magnetic array, while providing appropriate fluid cooling. Thus, the rotating magnetron generally requires a rotational drive mechanism, bearings to permit target rotation about the magnetic array, and electrical and cooling conduits.

Because such rotational drive mechanism and conduits extend from an ambient environment into the vacuum chamber, the rotating magnetron further requires the use of vacuum seals around the rotational drive mechanism and the electrical and cooling conduits. While vacuum and rotary water seals have been used for this purpose, such seals have a tendency to develop leaks under conditions of high temperature and high mechanical loading.

In previous rotating magnetrons, removal and replacement of the target structure involves the removal, handling and replacement of the critical vacuum seals. While such handling exposes the seals to moisture and contaminants, the replacement of the seals further presents the opportunity for improper reassembly. Thus, the reassembly of these rotating magnetrons puts seal integrity, a critical aspect of effective sputtering, in question.

Additionally, the removal and replacement of the target structure in these rotating magnetrons is complicated and requires several hours. Such inefficient removal and replacement procedures result in large labor and production costs for less than optimum product throughput. Further, during such prolonged removal and replacement periods, the coating chamber is exposed to the ambient environment and thus, to moisture and contaminants. Such exposure adversely effects both product quality and yield. Thus, in the reassembly of these rotating magnetrons, unnecessary production costs are incurred, significant production time is lost, and product quality and yield are compromised.

Accordingly, it is an object of the present invention to provide an improved rotatable magnetron having an easily removable and replaceable target structure.

It is a further object of the present invention to provide a method for the efficient removal and replacement of the target structure in a rotatable magnetron.

SUMMARY OF THE INVENTION

The present invention improves upon the rotatable magnetron by providing a-spindle for rotating the cylindrical sputtering target which is movable along a longitudinal axis of the target. Particularly, the spindle is axially movable with respect to a support located adjacent an end of the target. In preparation for the coating of substrates, the spindle is extended from the support to engage the sputtering target for rotation during such coating. Upon exhaustion of the sputtering surface of target, the spindle is retracted into the support to disengage the sputtered target for removal from the magnetron. With the spindle so retracted, a fresh sputtering target is positioned in the magnetron and the spindle is extended to engage the fresh target for rotation upon recommencement of substrate coating operations.

The present invention provides a further improvement with respect to the configuration of the structure which supports the stationary magnetic array within the rotatable cylindrical target. This magnet support structure is generally a cylindrical tube which extends along a length of the target, but ends short of the spindle support adjacent the target end. As the tube does not extend into the spindle support, it is easily removed from the magnetron along with the target upon retraction of the spindle from the target end.

Additionally, as the magnet support tube is not rigidly retained in the spindle support, it normally remains free to rotate with respect to the target. During the actual coating of substrates, however, the magnetic array should be stationary with respect to the rotating target. Therefore, the present invention provides a further axially movable structure within the spindle support which is extendable into the magnet support tube to engage the tube and thereby, to make it and the magnetic array stationary during coating. When the sputtering surface of the target has been exhausted by such coating, this fixing structure is retracted into the spindle support to disengage the magnet tube and thereby, to facilitate its removal along with the sputtered target.

The ability of the spindle and the fixing structure to move axially with respect to the spindle support, permits simple retraction of both away from a sputtered target and magnet support tube therein, respectively, to facilitate efficient removal of the target and the magnetic array therein from the rotatable magnetron. This ability also permits simple extension of the spindle and the fixing structure toward a fresh sputtering target to engage the new target and the magnet support tube therein, respectively; and thereby, to facilitate efficient replacement of the sputtered target with the new sputtering target.

A further improvement of the present invention lies in the provision of another axially movable spindle at an opposite end of the target, so that the typically lengthy and heavy sputtering target is adequately supported while still being easily removable and replaceable by a simple retraction of the spindles into supports located at both ends of the target.

The present invention provides for quick removal and replacement of a sputtered target in a rotatable magnetron by reducing the time required to accomplish this task from several hours in existing rotatable magnetrons to approximately twenty minutes or less in the improved rotatable magnetron apparatus. Further, in the present invention, such target removal and replacement may be accomplished by the use of simple, commonly available tools.

Additional objects, advantages and features of the various aspects of the present invention will become apparent from the following detailed description of the preferred embodiments, which description should be taken in conjunction with the accompanying drawings.

DESCRIPTION OF A PREFERRED EMBODIMENT

The rotatable magnetron apparatus of the present invention provides for the efficient removal and replacement of a cylindrical target once its sputtering surface has been exhausted over the course of substrate coating operations. Particularly, the rotatable magnetron simplifies disassembly and reassembly of the apparatus to provide a quick turnaround with minimal operational downtime.

Figure 1:
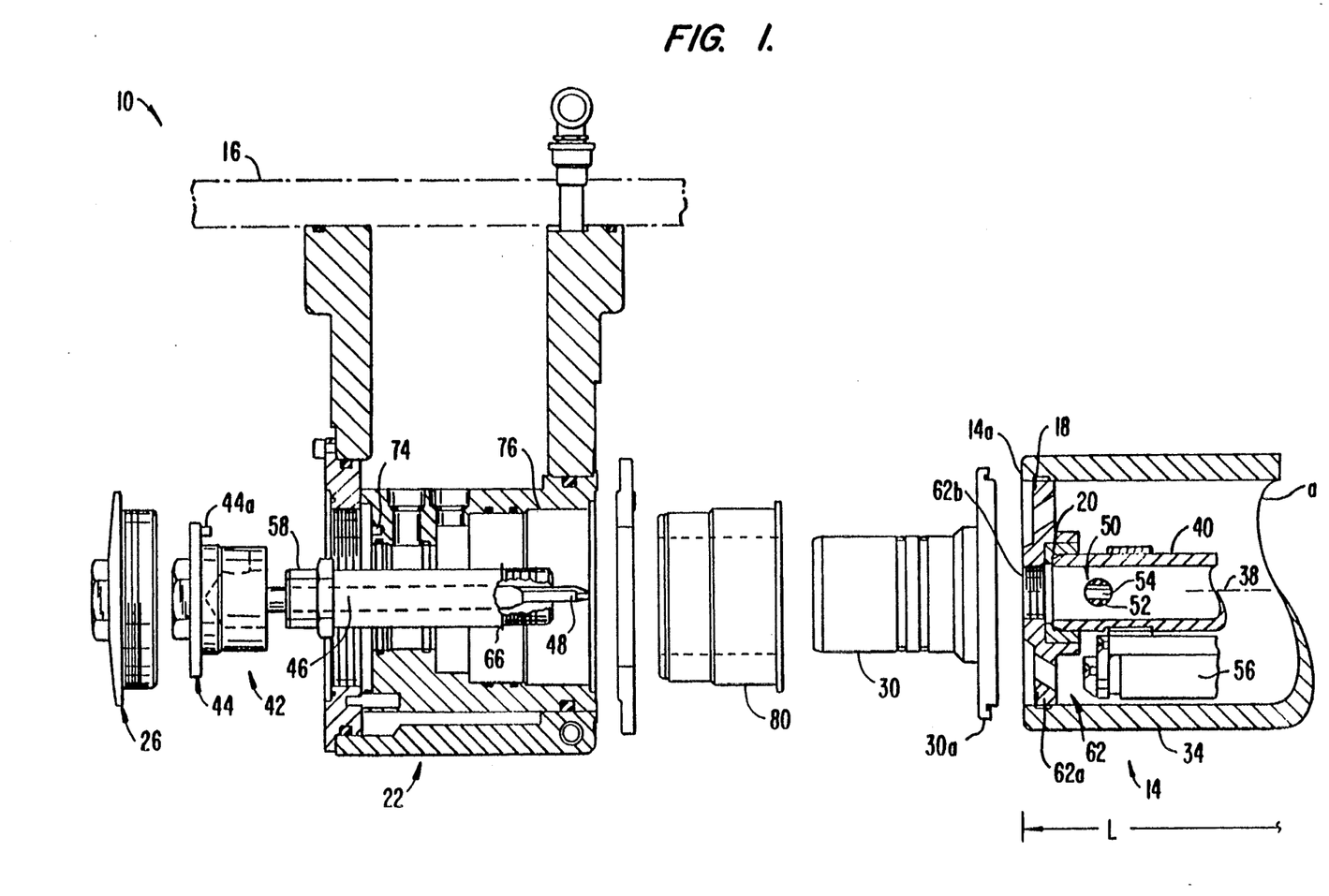
FIG. 1 is a longitudinal cross-sectional view of an end of a rotatable magnetron, shown schematically in disassembly, according to the present invention.
Figure 2:
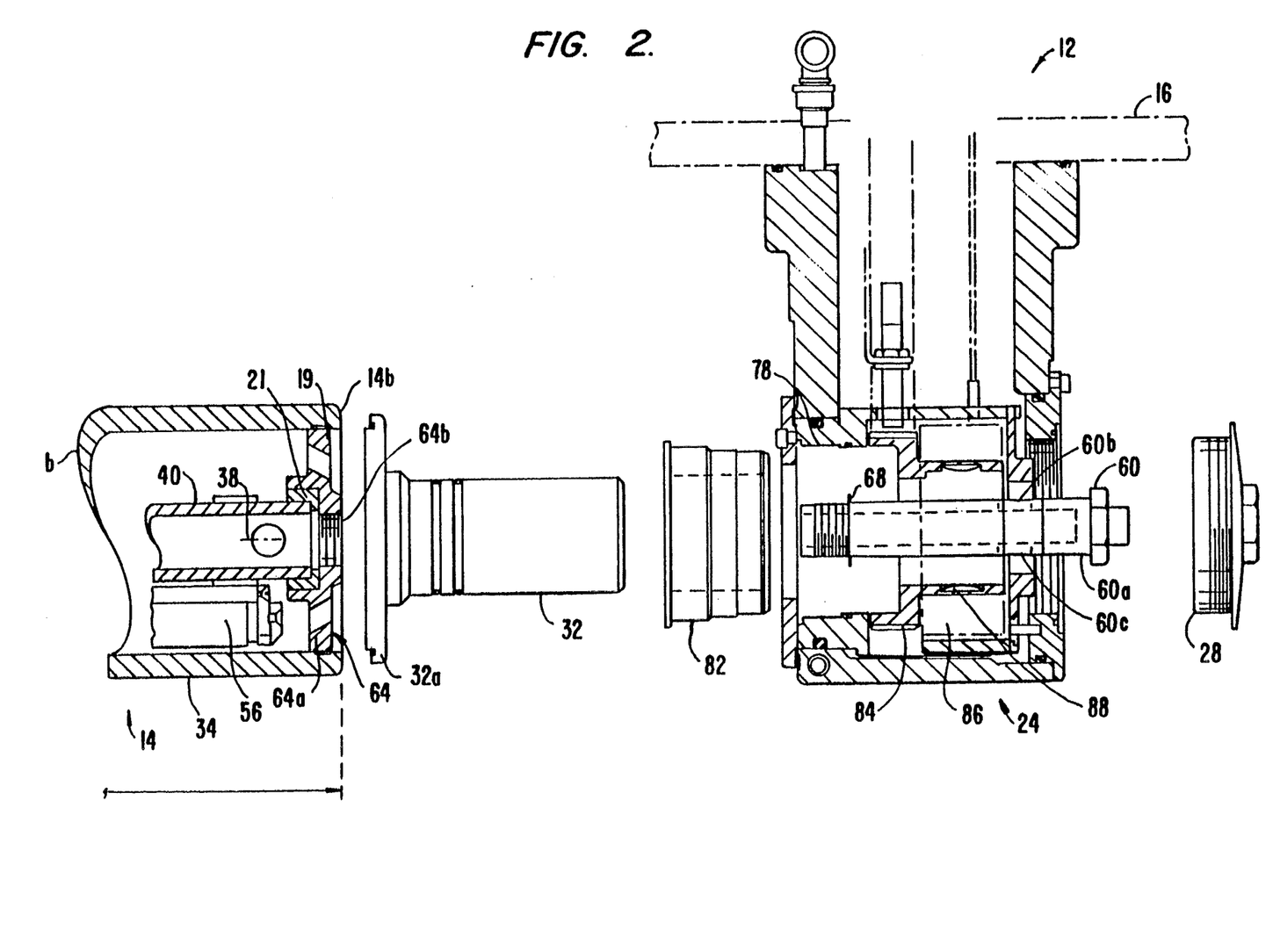
FIG. 2 is a longitudinal cross-sectional view of an opposite end of a rotatable magnetron from that of FIG. 1, shown schematically in disassembly, according to the present invention.

To illustrate such disassembly, the rotatable magnetron apparatus of the present invention is shown in disassembly in FIGS. 1 and 2. Particularly, the apparatus is shown to include a disassembled end 10, a disassembled opposite end 12, and a cylindrical target 14 disposed between ends 10 and 12. The magnetron end 10 is further shown in partial disassembly in FIG. 5. To illustrate reassembly, the same rotatable magnetron apparatus is shown in full assembly in FIGS. 3 and 4, in which the target 14 is disposed between an assembled end 10' and an assembled opposite end 12'.

In FIGS. 1 through 4, the target structure 14 is only partially shown because it is typically quite lengthy with respect to the end 10 or 10' and the opposite end 12 or 12' of the rotatable magnetron for the coating of large area substrates. However, the configuration of the disassembled and assembled rotatable magnetron apparatus will become apparent upon aligning and joining complementary jagged lines a and b of FIGS. 1 and FIG. 2, respectively, and a' and b' of FIGS. 3 and 4, respectively. In this configuration, the cylindrical target 14 is shown to include first and second target ends 14a and 14b, which define a target length L therebetween. On an outside surface of the target cylinder 14, a sputtering target surface 34 is formed. The target cylinder 14 is rotatable about a central longitudinal axis 38 so that the target surface 34 may be rotatably passed through a magnetic sputtering zone.

Following the above description of the sputtering apparatus of the present invention, like features and elements in the drawings will be referenced by generic reference numerals, unless specifically referred to by reference numerals followed by a prime symbol.

A support system for the rotatable magnetron will now be described in reference to FIGS. 1 through 4. The rotatable magnetron apparatus lies within a vacuum chamber which includes a supportive wall 16. While the vacuum chamber wall 16 is only partially shown, it extends from the end 10 to the opposite end 12 of the rotatable magnetron. Secured to the vacuum chamber wall 16 at ends 10 and 12 are end blocks 22 and 24, respectively.

The end blocks 22 and 24 (hereinafter referred to as first and second support structures 22 and 24, respectively) carry axially movable internal components, described below, for the disassembly and assembly of the rotatable magnetron. These internal components may be accessed through covers 26 and 28 to be moved axially to either engage or disengage ends 14a and 14b of the cylindrical target 14. In this manner, the first and second support structures 22 and 24 are capable of providing support for the typically heavy cylindrical target 14.

The axially movable components of the rotatable magnetron will now be described in relation to its disassembly and assembly, as illustrated in FIGS. 1, 2 and 5 and FIGS. 3 and 4, respectively. Particularly, when the magnetron is assembled, the first and second support structures 22 and 24 support a first spindle 30 and a second spindle 32. The first and second spindles 30 and 32 include flanges 30a and 32a, respectively, which are shaped to engage the first target end 14a and the second target end 14b, respectively, upon assembly.

At least one of first and second spindles 30 and 32 is axially movable with respect to its carrying support structure 22 or 24, respectively, along the central axis 38. In this manner, the axially movable spindle 30 or 32 can be easily extended to engage the target end upon assembly (FIGS. 3 and 4) or retracted to disengage the target end upon disassembly (i.e., FIG. 5). Particularly, when the axially movable spindle is sufficiently extended outwardly with respect to its carrying support structure, the flange 30a or 30b thereof engages the adjacent target end 14a or 14b, respectively. Similarly, when the axially movable spindle is sufficiently retracted inwardly with respect to its carrying support structure, the flange 30a or 30b thereof disengages from that target end. In this manner, one of target ends 14a and 14b may be engaged and disengaged from the axially movable spindle.

Alternatively, both target ends 14a and 14b may be engaged and disengaged in this manner, provided that both spindles 30 and 32 are axially movable. For simplicity, but not by way of limitation, both spindles will be discussed hereinafter as being axially movable unless it is stated otherwise.

Figure 3:
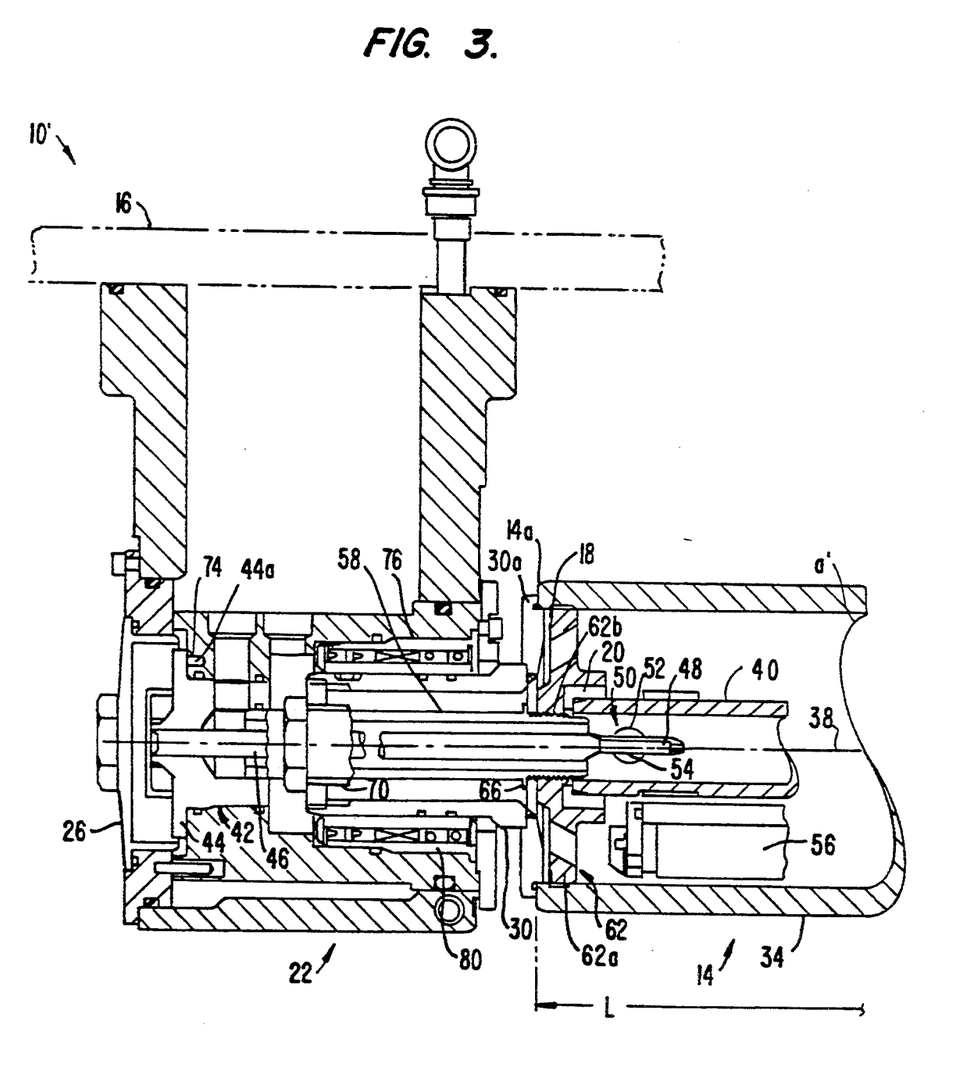
FIG. 3 is a longitudinal cross-sectional view of the end of a rotatable magnetron shown in FIG. 1, shown schematically in full assembly, according to the present invention.
Figure 4:
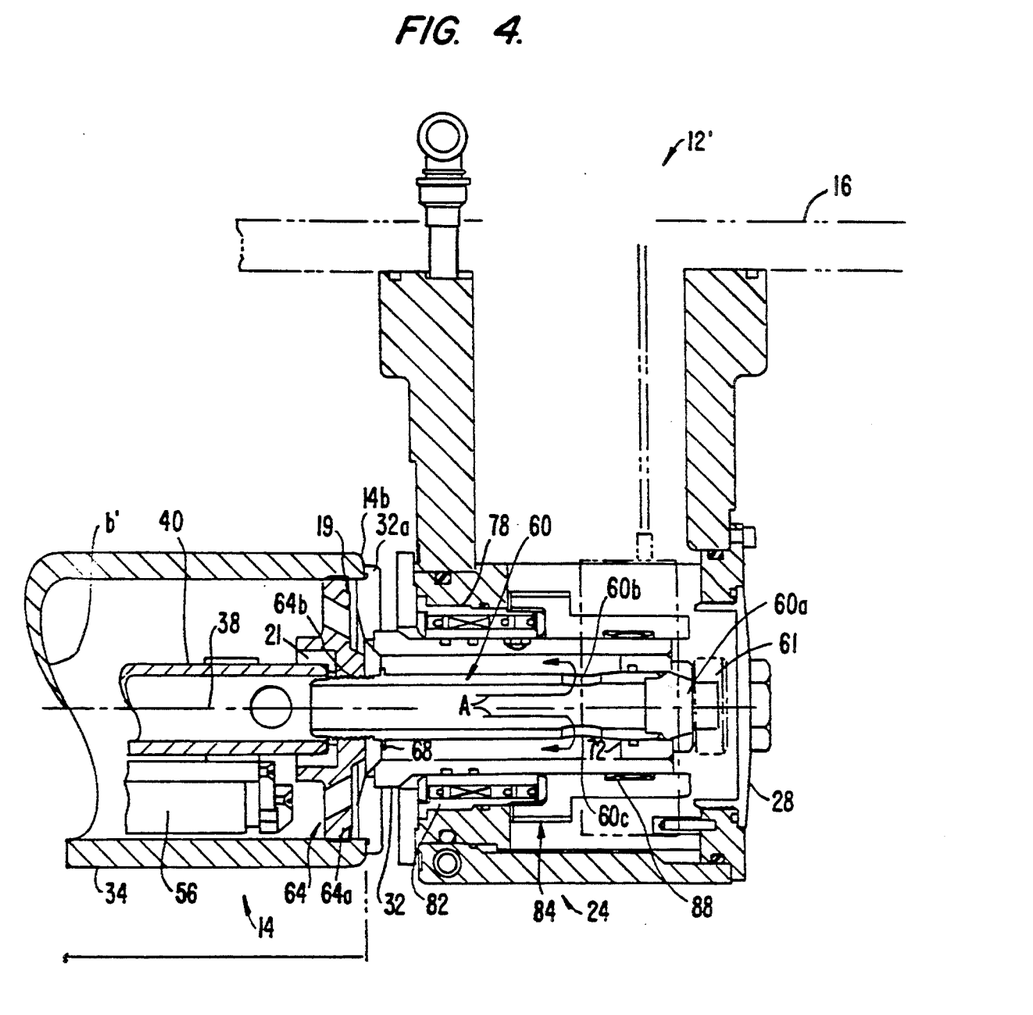
FIG. 4 is a longitudinal cross-sectional view of the opposite end of a rotatable magnetron shown in FIG. 2, shown schematically in full assembly, according to the present invention.
Figure 5:
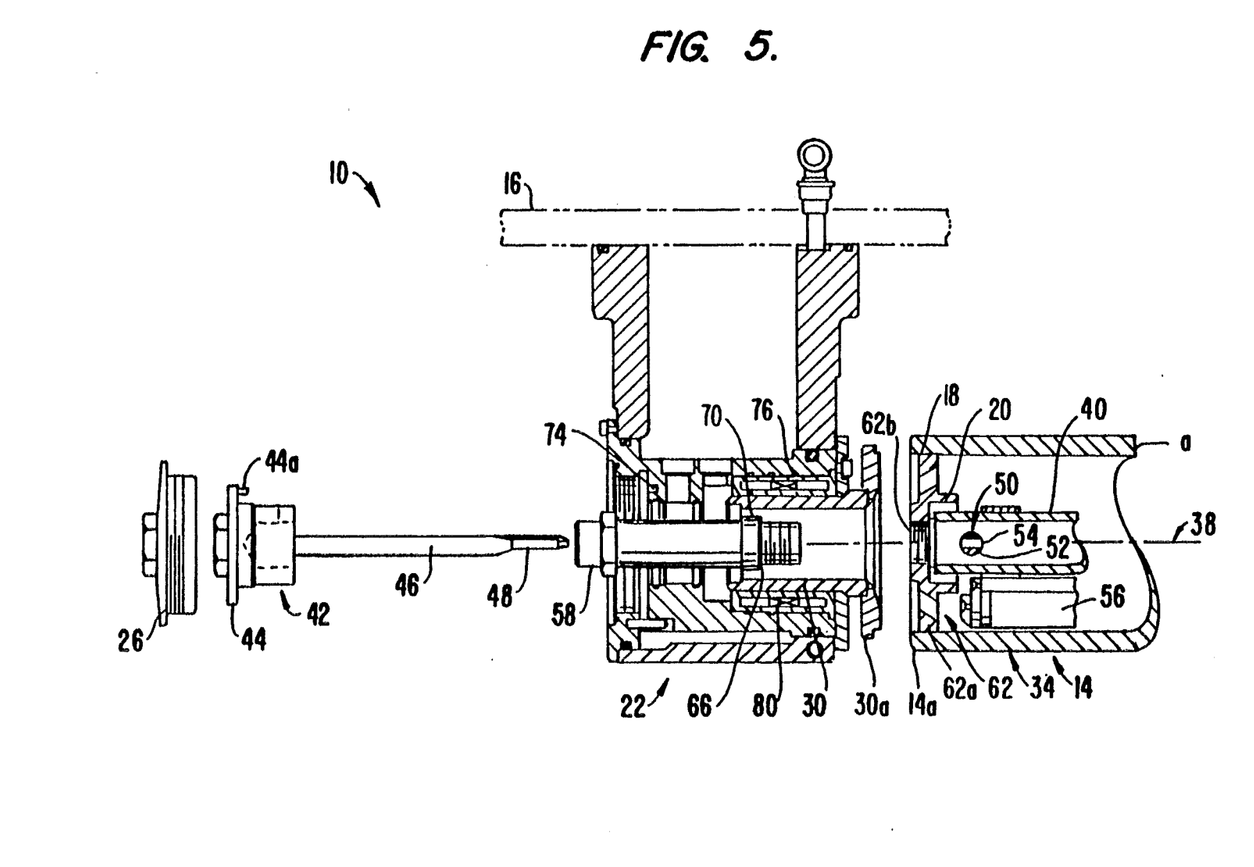
FIG. 5 is a longitudinal cross-sectional view of the end of a rotatable magnetron shown in FIG. 1, shown schematically in partial disassembly, according to the present invention.

In the present invention, such engagement and disengagement of the target cylinder 14 can be accomplished without the direct handling of the axially movable spindle 30 or 32 within the magnetron apparatus. Particularly, as shown in FIGS. 3, 4 and 5, disposed within spindles 30 and 32 are first and second spindle positioning structures 58 and 60, respectively, which are accessible from the outside of the magnetron apparatus through covers 26 and 28, respectively. These axially movable positioning structures 58 and 60 are designed to automatically engage spindles 30 and 32, respectively, to move them into their target engagement (FIGS. 3 and 4) and disengagement (FIG. 5) positions.

Target engagement, for example, is accomplished by extending the first and second positioning structures 58 and 60 and rigidly securing these structures in retention structures 62 and 64, respectively, located at the ends of the target cylinder 14. In this manner, as shown in FIGS. 3 and 4, the first and second positioning structures 58 and 60 become axially and rotationally fixed with respect to retention structures 62 and 64. Consequently, first and second spindles 30 and 32 become rigidly fixed, axially, in a target engagement position such that the flanges 30a and 32a, respectively, rigidly engage the first and second target ends 14a and 14b, respectively. In this target engagement position, spindles 30 and 32 become rotationally fixed with respect to the first and second target ends 14a and 14b engaged therewith, such that the spindles and the target cylinder rotate together.

By way of example, the first and second spindle positioning structures 58 and 60 are shown as threaded bolts in FIGS. 1 through 5. Further, retention structures 62 and 64 disposed within the target cylinder 14 (which may be held therein by one or more retaining rings 18 and 19) are shown as including plates 62a and 64a, respectively, which have threaded apertures 62b and 64b, respectively, for receiving the first and second positioning structures 58 and 60 which are complementarily threaded. As shown, support bearings 20 and 21 may be disposed between retaining structures 62 and 64 and the magnet structure 40.

Target disengagement is accomplished by retracting the first and second positioning structures 58 and 60 until engaging structures 66 and 68, respectively, which appear along outer surfaces of the positioning structures, engage a structure 70 and 72, respectively, of the first and second spindle 30 and 32, respectively. For example, as particularly shown in FIG. 5, upon sufficient retraction of the first positioning structure 58, the engaging structure 66 engages structure 70 of the first spindle 30 such that the first spindle 30 is automatically retracted therewith to disengage the target end 14a. By way of example, in FIGS. 1 through 5 structures 66 and 68 are shown as flanges for engaging complementary flanges 70 and 72, respectively.

A further axially movable component of the rotatable magnetron will now be described in relation to a configuration of a magnetic array 56 therein. As shown in FIGS. 1 through 5, disposed within the target structure 14 and extending substantially along the target length L is a magnet support structure 40. The magnet support structure 40 supports and rotationally fixes the magnetic array 56, which defines the sputtering zone of the rotatable magnetron.

Normally, the magnet support structure 40 is carried such that it is freely rotatable around the central axis 38. During coating, however, the magnetic sputtering zone should be stationary with respect to first support structure 22. Therefore, an axially movable fixing structure 42 is provided to fix a rotational position of the magnet structure 40 during coating. As shown in FIGS. 1, 3 and 5, the fixing structure 42 is axially movable with respect to its carrying first support structure 22 for extending therefrom into the magnet structure 40.

In the assembly of the rotatable magnetron apparatus in preparation for coating, the fixing structure 42 is extended into the magnet structure 40 to fix its rotational position with respect to one of the support structures 22 and 24. In this manner, the magnetic array 56 and the sputtering zone also become fixed with respect to that support structure. During coating, the target cylinder 14 is rotated via the first and second spindles 30 and 32 about the central axis 38 and the fixed magnet array 56, such that the target surface 34 is continually passed through the stationary sputtering zone. When the cylindrical target 14 has been exhausted and requires removal, the fixing structure 42 is simply retracted from the magnet structure to facilitate the removal of the surrounding target cylinder 14.

In the present invention, while the exhausted cylindrical target 14 is replaced with a new cylindrical target 14 having a fresh sputtering surface 34 for subsequent coating operations, the magnetic array 56 may be reused. Accordingly, once the exhausted cylindrical target 14 has been removed from the magnetron and the retaining rings 18 and 19, retaining structures 62 and 64 and support bearings 20 and 21 have been removed from the interior of the target 14, the magnet structure 40 therein is transferred to the new cylindrical target 14 and secured therein by the support bearings 18 and 19, retaining structures 62 and 64 and retaining rings 18 and 19. With the transferred magnet structure 40 in place, the first and second spindles 30 and 32 are extended to engage the first and second target ends 14a and 14b of the new target 14 and the fixing structure 42 is extended to engage the magnet structure 40.

In FIG. 5, the fixing structure 42 is shown to include a plug 44 having a pin 44a which is capable of fitting into a recess 74 within the first support structure 22. When pin 44a is fitted into the recess 74, the fixing structure 42 becomes rotationally fixed with respect to the first support structure 22. As further shown in FIG. 5, the fixing structure 42 includes a rod 46 and a blade 48 at an end of plug 44. The blade 48 is shaped such that when it is fixed in the above-described manner, it engages a securing member 50 disposed within magnet structure 40. By way of example, the securing member 50 includes a bar 52 (shown in cross-section in FIG. 5) having a slot 54 therein for receiving the blade 48.

For simplicity and not by way of limitation, the fixing structure 42 has been described in relation to the first support structure 22. However, it is understood that the fixing structure 42 is equally capable of being carried by the second support structure 24 such that it is axially movable with respect thereto for extending into the magnet structure 40. Similarly, it is understood that if the fixing structure 42 is carried by the second support structure 24, the second support structure 24 will have a recess therein (not shown) to rotationally fix the fixing structure 42 with respect to the second support structure 24.

It follows that one of the first and second support structures 22 and 24 carries both its respective spindle positioning structure 58 or 60 and the fixing structure 42. Therefore, as shown in FIGS. 1, 3 and 5, the spindle positioning structure 58 is hollow such that the fixing means 42 may be carried and axially moved therein. While the one support structure is shown to be the first support structure 22 in FIGS. 1, 3 and 5, it is understood that it could as easily be the second support structure 24 having a hollow spindle positioning structure 60 therein for internally carrying the fixing means 42.

In addition to providing support for the axially movable internal components described above, the first support structure 22 generally provides conduits (not shown) for supplying cooling fluid to and withdrawing cooling fluid from the target structure 14 at the end 10 of the rotatable magnetron. Thus, at the end 10, the spindle positioning structure 58 is hollow along substantially its entire length to accommodate the passage of cooling fluid therethrough, as shown in FIGS. 1, 3 and 5.

At the opposite end 12, the second support structure 24 generally provides power devices for rotating the target structure 14 including a drive source (not shown), a pulley 84 and pulley bearings (not shown). By way of example, the pulley 84 may be a drive pulley with an integral conductive ring (not shown). Generally, the second support structure 24 additionally provides electrical devices for electrically energizing the sputtering surface 34 of target structure 14 including an electrical conductor 86 and an electrical contact device 88, as shown in FIG. 2. By way of example, the electrical conductor 86 may be a carbon brush, while the electrical contact device 88 may be a spring-loaded conductive band.

As cooling fluid is not ordinarily supplied at this opposite end 12 of the rotatable magnetron, the spindle positioning structure 60 need not be hollow along substantially its entire length; rather, it may be solid at its end 60a, as shown in FIGS. 2 and 4, and lie adjacent a thrust bearing 61, as shown in FIG. 4. Thus, cooling fluid flowing through a hollow portion of the spindle positioning structure 60 flows out of apertures 60b and 60c into a channel between an exterior of the spindle positioning structure 60 and an interior of the second spindle 32, as indicated by the arrows A shown in FIG. 4.

The provision of cooling conduits, rotational drive devices and energizing devices is described in U.S. Pat. No. 5,096,562, which is incorporated herein by reference. While the cooling conduits and the rotational drive and electrical energizing devices have been described above with respect to the first and second support structures 22 and 24, respectively, it is understood that these conduits and devices may be provided by either one of the support structures 22 and 24.

In the present invention, the above-described axially movable components of the rotatable magnetron are so movable irrespective of any such cooling conduits, rotational drive devices or energizing devices provided by the first and second support structures 22 and 24. For example, second spindle 32 is axially movable with respect to pulley 84, pulley bearings (not shown), and electrical contact device 88. Particularly, when the electrical contact device 88 is a sliding contact device, such as a spring-loaded conductive band rather than a clamped contact device, the second spindle 32 is axially moved with respect thereto with ease.

The above-described conduits and devices typically communicate with an ambient environment having different conditions than those of the vacuum chamber. Therefore, the rotatable magnetron apparatus of the present invention preferably includes first and second seal cartridges 80 and 82, located within the first and second support structures, respectively, for sealing the vacuum chamber from the ambient environment.

Particularly, as shown in FIGS. 1 through 5, the first and second support structures 22 and 24 include first and second bearing surfaces 76 and 78, respectively. When the magnetron apparatus is assembled, the first and second seal cartridges 80 and 82 are placed in the support structures 22 and 34, respectively, between the bearing surfaces 76 and 78 and the first and second spindles 30 and 32. These seal cartridges 80 and 82 are designed to provide vacuum seals between the bearing surfaces 76 and 78 and outer surfaces of the first and second spindles 30 and 32, respectively. While the seal cartridges 80 and 82 are rotationally stationary with respect their respective support structures 22 and 24, they are axially movable with respect thereto to be easily removable therefrom for disassembly, as shown in FIGS. 1 and 2. The seal cartridges 80 and 82 of this preferred embodiment are described in a U.S. patent application Ser. No. 08/296,360 entitled "Cartridge Seal For a Rotatable Magnetron" and filed concurrently herewith by inventors John H. Bower, Henry A. Byorum and Ronald E. Rambeau, the entire disclosure of which is incorporated herein by this reference.

As is apparent from this description, the present invention improves upon previous rotatable magnetrons by adding new integral components to existing end block configurations to facilitate efficient removal and replacement of target cylinders without disassembly or handling of the end blocks, the internal assembly components, the cooling means, the rotational drive means, the electrical energizing means and the seals. Particularly, the axially movable components can be accessed from the outside of the end blocks and simply retracted and extended to facilitate removal and reassembly of the cylindrical target. Further, accessing, loosening and fixing these axially movable components for disassembly and assembly may be accomplished with simple tools, such as a commonly available socket wrench. In the above-described manner, the improved rotatable magnetron apparatus of the present invention reduces the time required to remove and replace a target cylinder from several hours to approximately twenty minutes or less.

It is to be understood that while the invention has been described above with respect to a specific preferred embodiment, the description is intended to illustrate and not to limit the scope of the invention, which is defined by the scope of the appended claims.

It is claimed:

1. In a rotatable magnetron apparatus within a vacuum chamber having: (1) a target structure including a target surface formed on an outside of a target cylinder, the target cylinder being rotatable about a central axis thereof and having first and second target ends which define a target length therebetween, (2) first and second support structures which are capable of providing support for the first and second target ends, respectively, (3) first and second spindles carried by the first and second support structures, respectively, which are capable of engaging the first and second target ends, respectively, and (4) a magnet structure disposed within the target structure and extending substantially along the target length, the target structure being rotatable with respect to the magnet structure, a combination comprising:

said first spindle characterized by being axially movable with respect to the first support structure to engage the first target end when sufficiently extended outwardly with respect to the first support structure and to disengage from the first target end when sufficiently retracted inwardly with respect to the first support structure;

said magnet structure characterized by being carried within the target structure such that said magnet structure is freely rotatable around the central axis; and means carried by one of the first and second support structures and axially movable with respect thereto for extending from said one support structure into said magnet structure to selectively fix a rotational position of said magnet structure with respect to said one support structure.

2. The apparatus according to claim 1, said combination further comprising:

means for positioning said first and second spindles, said first and second spindle positioning means carried by the first and second support structures, respectively, and axially movable with respect thereto for extending therefrom into the target structure; and means disposed within the target structure for rigidly retaining said first and second spindle positioning means within said retaining means such that said first and second spindle positioning means are axially and rotationally fixed with respect thereto, thereby to selectively rigidly fix axial positions of said first and second spindles such that said first and second spindles rigidly engage the first and second target ends, respectively.

3. The apparatus according to claim 1, in which said second spindle is axially movable with respect to the second support structure to engage the second target end when sufficiently extended outwardly with respect to the second support structure and to disengage from the second target end when sufficiently retracted inwardly with respect to the second support structure.

4. The apparatus according to claim 3, said combination further comprising:

means for positioning said first and second spindles, said first and second spindle positioning means carried by the first and second support structures, respectively, and axially movable with respect thereto for extending therefrom into the target structure; and means disposed within the target structure for rigidly retaining said first and second spindle positioning means within said retaining means such that said first and second spindle positioning means are axially and rotationally fixed with respect thereto, thereby to selectively rigidly fix axial positions of said first and second spindles such that said first and second spindles rigidly engage the first and second target ends, respectively.

5. The apparatus according to any one of claims 2 or 4 in which the first spindle positioning means has a structure along a length and adjacent an outer surface thereof for engaging said first spindle, such that when the first spindle positioning means is sufficiently retracted from the first target end and inwardly with respect to the first support structure, the engaging structure engages said first spindle, thereby to retract said first spindle therewith.

6. The apparatus according to any one of claims 2 or 4 in which one of the first and second positioning means, said one positioning means being the positioning means which is carried by said one support structure, is hollow, said fixing means being carried within said one positioning means and axially movable with respect thereto.

7. The apparatus according to claim 4 in which said second spindle positioning means has a structure along a length and adjacent an outer surface thereof for engaging said second spindle, such that when the second spindle positioning means is sufficiently retracted from the second target end and inwardly with respect to the second support structure, the engaging structure engages said second spindle, thereby to retract said second spindle therewith.

8. The apparatus according to claim 1 in which said fixing means includes a plug at an end thereof which is capable of engaging a securing member disposed within said magnet structure.

9. In a magnetron of a type having: (1) a target structure including a target surface formed on an outside of a target cylinder, the target cylinder being rotatable about a central axis thereof and having first and second target ends which define a target length therebetween, (2) first and second support structures which are capable of providing support for first and second target ends, respectively, (3) first and second spindles carried by the first and second support structures, respectively, which are capable of engaging the first and second target ends, respectively, and (4) a magnet structure disposed within the target structure and extending substantially along the target length, the target structure being rotatable with respect to the magnet structure, a method of replacing the target structure with a replacement target structure having a replacement magnet structure therein, comprising the following steps:

(a) disengaging said first and second spindles from the first and second target ends, respectively;

(b) retracting at least one of said disengaged spindles with respect to one of the first and second support structures that is closest thereto from one of the first and second target ends that is closest thereto;

(c) removing the target structure from the magnetron; and (d) engaging first and second target ends of the replacement target structure with said first and second spindles, respectively.

10. The method according to claim 9, further comprising providing means for engaging said magnet structure to selectively fix a rotational position thereof with respect to one of said first and second support structures, disengaging said fixing means from said magnet structure prior to step (c), and engaging said replacement magnet structure with said fixing means.

11. The method according to claim 9 in which said magnet structure and said replacement magnet structure are the same magnet structure, further comprising transferring said magnet structure from the target structure to the replacement target structure between steps (c) and (d).

12. In a rotatable magnetron apparatus within a vacuum chamber having: (1) a target structure including a target surface formed on an outside of a target cylinder, the target cylinder being rotatable about a central axis thereof and having target ends which define a target length therebetween, (2) a support structure which is capable of providing support for the target cylinder at one of the target ends, (3) a spindle, carried by the support structure, which is capable of engaging the one target end, and (4) a magnet structure disposed within the target structure and extending substantially along the target length, the target structure being rotatable with respect to the magnet structure, an improvement comprising:

said spindle characterized-by being axially movable with respect to the support structure to engage the one target end when sufficiently extended outwardly with respect to the support structure and to disengage from the one target end when sufficiently retracted inwardly with respect to the support structure.

13. In a rotatable magnetron apparatus within a vacuum chamber having: (1) a target structure including a target surface formed on an outside of a target cylinder, the target cylinder being rotatable about a central axis thereof and having target ends which define a target length therebetween, (2) a support structure which is capable of providing support for the target cylinder at one of the target ends, (3) a spindle, carried by the support structure, which is capable of engaging the one target end, and (4) a magnet structure disposed within the target structure and extending substantially along the target length, the target structure being rotatable with respect to the magnet structure, an improvement comprising:

said magnet structure characterized by being carried within the target structure such that said magnet structure is freely rotatable around the central axis; and means carried by the support structure and axially movable with respect thereto for extending from said support structure into said magnet structure to selectively fix a rotational position of said magnet structure with respect to said support structure.

14. In a rotatable magnetron apparatus of a type having: (1) a target structure including a target surface formed on an outside of a target cylinder, the target cylinder being rotatable about a central axis thereof and having target ends which define a target length therebetween, (2) a support structures which is capable of providing support for the target cylinder at one of the target ends, (3) a spindle, carried by the support structure, which is capable of engaging the one target end, and (4) a magnet structure disposed within the target structure and extending substantially along the target length, the target structure being rotatable with respect to the magnet structure, a method of replacing the target structure with a replacement target structure having a replacement magnet structure therein, comprising the following steps:

(a) disengaging said spindle from the one target end;
(b) retracting said disengaged spindle with respect to the support structure from the one target end;
(c) removing the target structure from the magnetron; and
(d) engaging the one target end of the replacement target structure with said spindle.

15. The method according to claim 14, further comprising providing means for engaging said magnet structure to selectively fix a rotational position thereof with respect to said support structure, disengaging said fixing means from said magnet structure prior to step (c), and engaging said replacement magnet structure with said fixing means.

* * * * *